United States Patent
Waqar et al.

(10) Patent No.: US 10,916,451 B2
(45) Date of Patent: *Feb. 9, 2021

(54) SYSTEMS AND METHODS OF GAP CALIBRATION VIA DIRECT COMPONENT CONTACT IN ELECTRONIC DEVICE MANUFACTURING SYSTEMS

(71) Applicant: Applied Materials, Inc., Santa Clara, CA (US)

(72) Inventors: Mohsin Waqar, Oakland, CA (US); Marvin L. Freeman, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 16/453,740

(22) Filed: Jun. 26, 2019

(65) Prior Publication Data

US 2019/0318940 A1 Oct. 17, 2019

Related U.S. Application Data

(63) Continuation of application No. 15/632,031, filed on Jun. 23, 2017, now Pat. No. 10,361,099.

(51) Int. Cl.
*G05B 19/04* (2006.01)
*G05B 19/18* (2006.01)
(Continued)

(52) U.S. Cl.
CPC .. *H01L 21/67011* (2013.01); *H01L 21/67201* (2013.01); *H01L 21/67259* (2013.01); *G05B 2219/45031* (2013.01); *H01L 21/687* (2013.01)

(58) Field of Classification Search
CPC .... G05B 2219/45031; H01L 21/67011; H01L 21/67201; H01L 21/67259; H01L 21/687
See application file for complete search history.

(56) References Cited

U.S. PATENT DOCUMENTS 5,100,502 A 3/1992 Murdoch et al.
5,707,500 A * 1/1998 Shimamura ........... C23C 14/541
118/666

(Continued)

FOREIGN PATENT DOCUMENTS

| CN | 104723235 A | 6/2015 |
| KR | 10-1134277 B1 | 4/2012 |
| TW | I549210 B | 9/2016 |

OTHER PUBLICATIONS

International Search Report and Written Opinion of International Application No. PCT/US2018/034704 dated Aug. 24, 2018.

*Primary Examiner* — Harry Y Oh

(74) *Attorney, Agent, or Firm* — Lowenstein Sandler LLP

(57) ABSTRACT

An electronic device manufacturing system includes a motion control system for calibrating a gap between surfaces of process chamber or loadlock components by moving those component surfaces into direct contact with each other. The component surfaces may include a surface of a substrate and/or a substrate support and a surface of process delivery apparatus, which may be, e.g., a pattern mask and/or a plasma or gas distribution assembly. The motion control system may include a motion controller, a software program executable by the motion controller, a network, one or more actuator drivers, a software program executable by the one or more actuator drivers, one or more actuators, and one or more feedback devices. Methods of calibrating a gap via direct contact of process chamber or loadlock component surfaces are also provided, as are other aspects.

20 Claims, 5 Drawing Sheets

(51) Int. Cl.
*H01L 21/67* (2006.01)
*H01L 21/687* (2006.01)

(56) References Cited

U.S. PATENT DOCUMENTS

| | | | |
|---|---|---|---|
| 5,951,770 A | 9/1999 | Perlov et al. | |
| 6,287,386 B1 | 9/2001 | Perlov et al. | |
| 6,468,353 B1 | 10/2002 | Perlov et al. | |
| 6,542,925 B2 | 4/2003 | Brown et al. | |
| 6,575,737 B1 | 6/2003 | Perlov et al. | |
| 6,916,397 B2 | 7/2005 | Pfeiffer et al. | |
| 7,648,391 B2* | 1/2010 | Nishimura | H01R 33/975 439/564 |
| 7,720,655 B2 | 5/2010 | Rice | |
| 8,033,771 B1 | 10/2011 | Gage et al. | |
| 8,852,349 B2* | 10/2014 | Chacin | C23C 16/45521 118/728 |
| 9,323,235 B2 | 4/2016 | Chaffee | |
| 9,520,303 B2 | 12/2016 | Wang et al. | |
| 9,617,640 B2 | 4/2017 | Yudovsky et al. | |
| 2002/0045956 A1 | 4/2002 | Kapitan | |
| 2002/0129323 A1* | 9/2002 | Kasukabe | G01R 31/2889 324/756.03 |
| 2002/0170672 A1 | 11/2002 | Perlov et al. | |
| 2004/0151562 A1 | 8/2004 | Hofmeister et al. | |
| 2005/0072716 A1 | 4/2005 | Quiles et al. | |
| 2006/0102697 A1 | 5/2006 | Nagai et al. | |
| 2008/0056857 A1 | 3/2008 | Hiroki | |
| 2008/0210258 A1 | 9/2008 | Yudovsky et al. | |
| 2008/0310158 A1 | 12/2008 | Harbers et al. | |
| 2009/0060480 A1* | 3/2009 | Herchen | H01L 21/67248 392/416 |
| 2009/0108544 A1 | 4/2009 | Sico et al. | |
| 2009/0272496 A1 | 11/2009 | Yamamoto et al. | |
| 2011/0024930 A1* | 2/2011 | Sato | G03F 7/0002 264/40.1 |
| 2012/0003836 A1* | 1/2012 | Kellogg | H01L 21/68735 438/710 |
| 2012/0114840 A1 | 5/2012 | Fukuda et al. | |
| 2012/0190138 A1* | 7/2012 | Tanida | H01L 21/67092 438/14 |
| 2012/0256566 A1 | 10/2012 | Chaffee | |
| 2014/0262035 A1 | 9/2014 | Merry et al. | |
| 2014/0262036 A1 | 9/2014 | Reuter et al. | |
| 2014/0262755 A1 | 9/2014 | Deshmukh et al. | |
| 2014/0263165 A1 | 9/2014 | Hongkham et al. | |
| 2014/0271057 A1 | 9/2014 | Weaver et al. | |
| 2014/0273487 A1 | 9/2014 | Deshmukh et al. | |
| 2015/0013771 A1 | 1/2015 | Quiles et al. | |
| 2015/0045961 A1 | 2/2015 | Koshti et al. | |
| 2015/0070814 A1 | 3/2015 | Parkhe et al. | |
| 2015/0082625 A1 | 3/2015 | Rice et al. | |
| 2015/0083330 A1 | 3/2015 | Madiwal et al. | |
| 2015/0340193 A1 | 11/2015 | Yoshikawa et al. | |
| 2015/0357228 A1 | 12/2015 | Busche et al. | |
| 2015/0376782 A1 | 12/2015 | Griffin et al. | |
| 2016/0007411 A1 | 1/2016 | Busche et al. | |
| 2016/0007412 A1 | 1/2016 | Busche et al. | |
| 2016/0126402 A1* | 5/2016 | Shahar | G01T 1/249 257/428 |
| 2016/0153085 A1 | 6/2016 | Ueda | |
| 2016/0215396 A1 | 7/2016 | Khandelwal et al. | |
| 2016/0225646 A1 | 8/2016 | Rice et al. | |
| 2016/0240410 A1 | 8/2016 | Reuter et al. | |
| 2016/0268173 A1 | 9/2016 | Broadway | |
| 2016/0345384 A1 | 11/2016 | Zhang et al. | |
| 2016/0358792 A1 | 12/2016 | Madiwal et al. | |
| 2017/0011887 A1 | 1/2017 | Deshmukh et al. | |
| 2017/0073550 A1 | 3/2017 | Barrios et al. | |
| 2017/0092511 A1 | 3/2017 | Basu et al. | |
| 2017/0115169 A1 | 4/2017 | Busche | |
| 2017/0117172 A1 | 4/2017 | Genetti et al. | |
| 2017/0211706 A1 | 7/2017 | Amir et al. | |
| 2017/0290166 A1 | 10/2017 | Rice et al. | |
| 2018/0082870 A1 | 3/2018 | Wolgast | |

\* cited by examiner

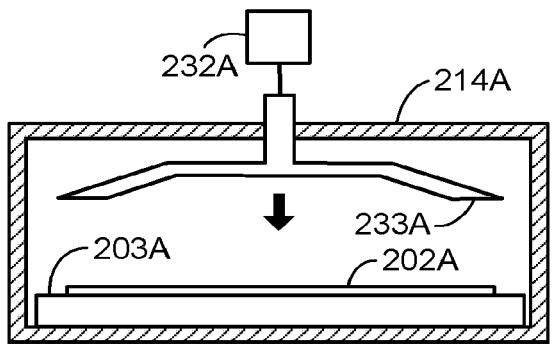
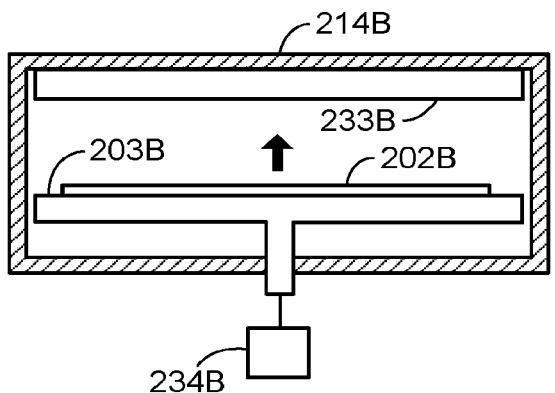
*FIG. 2A*  *FIG. 2B*
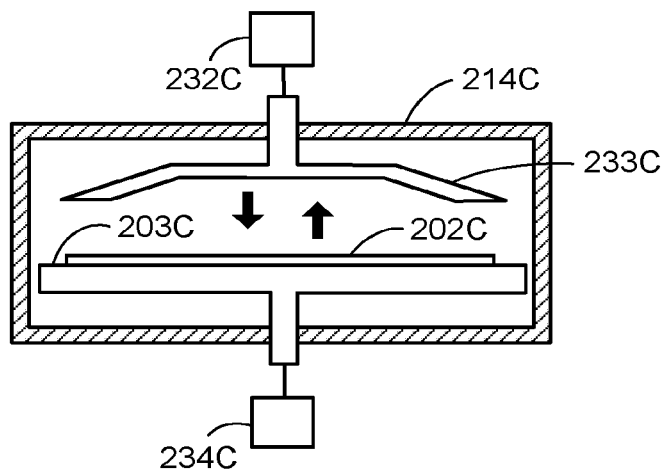
*FIG. 2C*
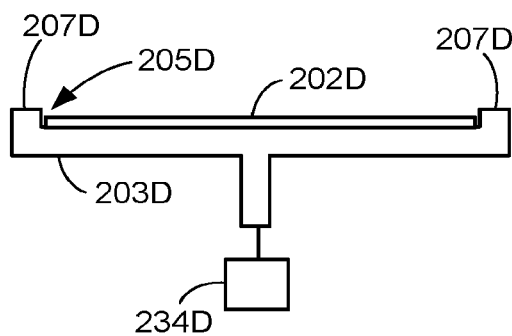
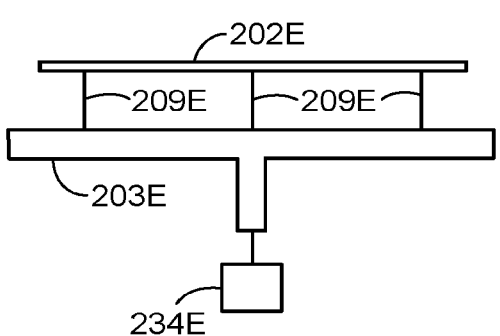
*FIG. 2D*  *FIG. 2E*

$$P = P_{pos}P_{vel} + I_{vel}$$
$$I = P_{pos}I_{vel}$$

SYSTEMS AND METHODS OF GAP CALIBRATION VIA DIRECT COMPONENT CONTACT IN ELECTRONIC DEVICE MANUFACTURING SYSTEMS

RELATED APPLICATIONS

The present application is a continuation of U.S. patent application Ser. No. 15/632,031 filed Jun. 23, 2017, which is incorporated by reference herein.

FIELD

This disclosure relates to systems and methods of distributed motion control of apparatus used to support and process substrates in electronic device manufacturing systems.

BACKGROUND

An electronic device manufacturing systemmay include one or more process chambers in which substrates are processed to fabricate thereon electronic devices (e.g., integrated circuits and/or flatpanel displays). The process chambers may be operated at a vacuum level (ranging from about, e.g., 0.01 Torr to about 80 Torr) and at high temperatures (ranging from about, e.g., 100 degrees C. to 700 degrees C.). A same or different substrate process, such as, e.g., deposition, etching, annealing, curing, or the like of a film layer on a substrate, may take place in each process chamber of the electronic device manufacturing system. Substrate processing may also occurring a loadlock of some electronic device manufacturing systems. A loadlock is a chamber through which substrates are transferred between process chambers and a factory interface for transport elsewhere in an electronic device manufacturing system.

In a substrate process, one or more film layers of a desired material having a desired thickness and uniformity may be selectively applied to or removed from a substrate via process delivery apparatus, such as, e.g., a pattern mask and/or a plasma or gas distribution assembly. To ensure that such desired thicknesses and uniformities are precisely applied or removed, a gap between a substrate and the process delivery apparatus should be tightly controlled. However, as the size of process chambers increases to handle larger substrate sizes, larger batch loads of substrates, and higher process temperatures (which may affect the thermal expansion of process components), the desired gap may become more difficult to control. Electronic device manufacturing systems may therefore benefit from improved gap calibration systems and methods.

SUMMARY

According to a first aspect, a motion control system of an electronic device manufacturing system is provided. The motion control system comprises a motion controller comprising a programmable processor, a memory, and a gap calibration software program stored in the memory and executable by the programmable processor. The motion control system also comprises an actuator driver coupled to the motion controller and comprising a driver software program. The motion control system further comprises an actuator coupled to the actuator driver and to a process delivery apparatus or a substrate support located in a process chamber or loadlock, wherein the actuator is configured to move the process delivery apparatus or the substrate support. The motion control system still further comprises a feedback device coupled to the actuator and to the motion controller. The gap calibration software program is configured to cause direct contact between respective surfaces of the process delivery apparatus and the substrate support or a substrate received on the substrate support.

According to a second aspect, an electronic device manufacturing system is provided. The electronic device manufacturing system comprises a transfer chamber and a process chamber coupled to the transfer chamber, wherein the transfer chamber is configured to transfer one or more substrates to and from the process chamber, and the process chamber is configured to process the one or more substrates therein. The electronic device manufacturing system also comprises a loadlock coupled to the transfer chamber, wherein the transfer chamber is configured to transfer the one or more substrates to and from the loadlock. The electronic device manufacturing system further comprises a motion controller comprising a programmable processor, a memory, and a gap calibration software program stored in the memory and executable by the programmable processor. The gap calibration software program is configured to cause direct contact within the process chamber between respective surfaces of process delivery apparatus and a substrate support or one of the one or more substrates received on the substrate support.

According to a third aspect, a method of calibrating a gap between component surfaces in a process chamber or a loadlock of an electronic device manufacturing system is provided. The method comprises the following: preparing for a gap calibration by issuing preparatory instructions from a motion controller to one or more actuator drivers; actuating one or more actuators in the process chamber or the loadlock to cause direct contact between the component surfaces without taking the process chamber or the loadlock offline; and responding to detected direct contact between the component surfaces.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are for illustrative purposes only and are not necessarily drawn to scale. The drawings are not intended to limit the scope of the disclosure in any way.

FIGS. 2A-2E illustrate various schematic side views of process component configurations according to embodiments of the disclosure.

DETAILED DESCRIPTION

Reference will now be made in detail to example embodiments of the disclosure, which are illustrated in the accompanying drawings. Wherever possible, the same reference numbers will be used throughout the drawings to refer to the same or like parts.

Electronic device manufacturing systems in accordance with one or more embodiments of the disclosure may include a distributed motion control system configured to detect direct contact of moving process components inside a process chamber or a loadlock configured to process substrates. Direct contact detection by a motion controller executing a gap calibration software program may be used to calibrate gap spacing between surfaces of process components. Calibrating and then tightly controlling gap spacing may advantageously improve film deposition and/or film etching properties including application and/or removal of desired thicknesses and uniformities.

Tightly controlling gap spacing may also advantageously affect the rate of film deposition and/or etching. When precisely controlled, gap spacing may further improve matching of process chamber performance in an electronic device manufacturing system with two or more process chambers. Desired gap spacing varies by application. For example, desired gap spacing for atomic layer deposition may vary between 4 mils and 80 mils for a gap between a chemical injector and a substrate, and desired gap spacing for a bevel etch may vary between 1 mil and 20 mils for a gap between a pattern mask and a substrate.

The direct contact between process component surfaces during gap calibration may include contact between any combination of the following: a substrate surface, a substrate support surface, and/or a process delivery apparatus surface.

Further details of example embodiments illustrating and describing gap calibration via direct contact of process component surfaces, as well as other aspects including methods of calibrating a gap between process component surfaces in a process chamber or loadlock of an electronic device manufacturing system, will be explained in greater detail below in connection with FIGS. 1-5B.

Figure 1:
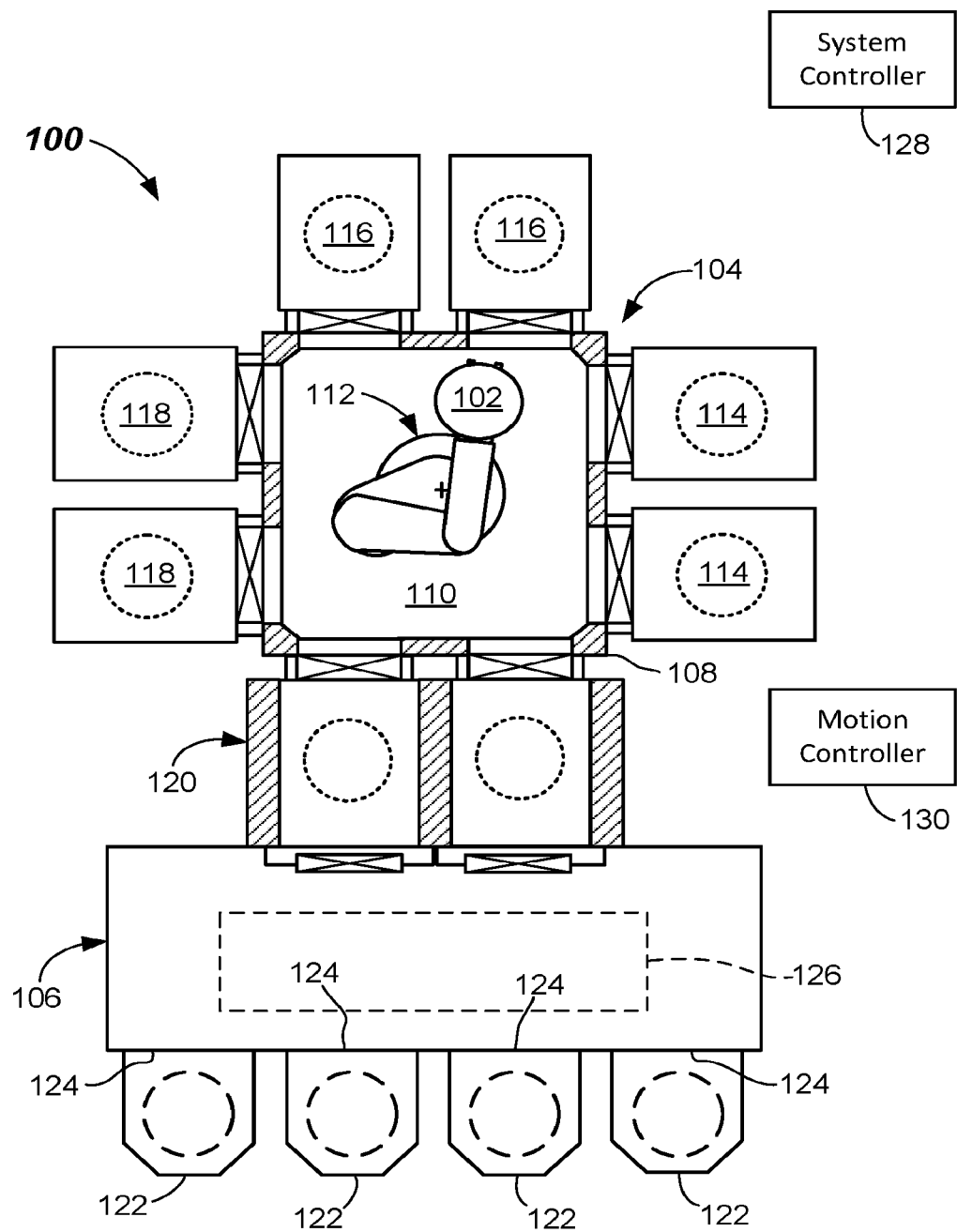
FIG. 1 illustrates a schematic top view of an electronic device manufacturing system according to embodiments of the disclosure.

FIG. 1 illustrates an electronic device manufacturing system 100 in accordance with one or more embodiments. Electronic device manufacturing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon. In some embodiments, the substrate may be, e.g., a 200 mm, 300 mm or 450 mm diameter semiconductor wafer.

Electronic device manufacturing system 100 may include a process tool 104 and a factory interface 106 coupled to process tool 104. Process tool 104 may include a housing 108 having a transfer chamber 110 therein, and transfer chamber 110 may have a substrate transfer robot 112 located therein. A plurality of process chambers 114, 116, and 118 may be coupled to housing 108 and transfer chamber 110. A loadlock 120 may also be coupled to housing 108 and transfer chamber 110. Transfer chamber 110, process chambers 114, 116, and 118, and loadlock 120 may be maintained at a vacuum level. The vacuum level for transfer chamber 110 may range from about, e.g., 0.01 Torr to about 80 Torr. Other vacuum levels may be used.

Transfer robot 112 may include multiple arms and one or more end effectors that are configured to transfer substrates 102 to and from any process chamber and loadlock physically coupled to transfer chamber 110 (note that substrates 102 and substrate placement locations are shown in FIG. 1 as circles).

A same or different substrate process may take place in each of process chambers 114, 116, and 118, such as, e.g., atomic layer deposition (ALD), physical vapor deposition (PVD), chemical vapor deposition (CVD), etching, annealing, curing, pre-cleaning, metal or metal oxide removal, or the like, on one or more substrates. For example, a PVD process may take place in one or both of process chambers 114, an etching process may take place in one or both of process chambers 116, and an annealing process may take place in one or both of process chambers 118.

Other processes may be carried out on substrates therein.

Loadlock 120 may be configured to interface with, and be coupled to, transfer chamber 110 on one side and factory interface 106 on an opposite side. Loadlock 120 may have an environmentally-controlled atmosphere that may be changed from a vacuum environment (wherein substrates may be transferred to and from transfer chamber 110) to an at or near atmospheric-pressure inert-gas environment (wherein substrates may be transferred to and from factory interface 106).

In some embodiments, loadlock 120 may be a stacked loadlock having a pair of upper interior chambers and a pair of lower interior chambers that are located at different vertical levels (e.g., one above another). In some embodiments, the pair of upper interior chambers may be configured to receive processed substrates from transfer chamber 110 for removal from process tool 104, while the pair of lower interior chambers may be configured to receive substrates from factory interface 106 for processing in process tool 104. In some embodiments, loadlock 120 may be configured to perform a substrate process (e.g., an etch or a pre-clean) on one or more substrates 102 received therein.

Factory interface 106 may be any suitable enclosure, such as, e.g., an Equipment Front End Module or EFEM. Factory interface 106 may be configured to receive substrates 102 from substrate carriers 122 (which may be, e.g., Front Opening Unified Pods or FOUPs) docked at various load ports 124 of factory interface 106. A factory interface robot 126 (shown dotted) may be used to transfer substrates 102 between substrate carriers 122 and loadlock 120. Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas).

The movement of transfer robot 112 and factory interface robot 126 and transfer of substrates 102 within and/or between process chambers 114, 116, and 118; loadlock 120; factory interface 106; and substrate carriers 122 may be controlled by a motor drive system (not shown in FIG. 1), which may include a plurality of servo or stepper motors.

Electronic device manufacturing system 100 may also include a system controller 128. System controller 128 may be coupled to each of the active hardware components to control operation thereof. System controller 128 may include a programmable processor, a memory that stores processor executable instructions/software programs/firmware, various support circuits, and input/output circuits. System controller 128 may also be configured to permit entry and display of data, operating commands, and the like by a human operator.

Electronic device manufacturing system 100 may further include a motion controller 130, described in more detail below in connection with FIGS. 3-5B. Motion controller 130 may include a programmable processor, a memory that stores processor executable instructions/software programs/firmware, various support circuits, and input/output circuits.

Motion controller 130 may operate in a closed-loop position control system, which may be referred to as servo control system, to collect and process data from actuator (motion) equipment within electronic device manufacturing system 100 by using various devices that may be coupled to a network both internal and external to the actuator (motion) drives of the actuator (motion) equipment for high-level supervisory tasks beyond commutation of a motor. Motion controller 130 may operate independently of system controller 128, may provide information to system controller 128, and/or may be controlled by system controller 128. Alternatively, system controller 128 may perform the functions of motion controller 130, which may be omitted from electronic device manufacturing system 100.

While process variability tolerance in the semiconductor industry continues to decrease as the size of semiconductor devices shrink, there is a need to maintain a tightly controlled gap between process components during substrate processing (e.g., deposition, annealing, curing, etching, and or other processing of a film on a substrate in a process chamber or loadlock).

Process components may include substrate support and process delivery apparatus. Substrate support apparatus may include single or multi-axis actuators (e.g., motors) and may have single or multi-slot (two or more vertically) stacked substrates that may have lifts, elevators, or indexers to transport and support a substrate. Various embodiments of process delivery apparatus may have actuators that may be used to position process delivery assemblies (e.g., pattern masks and/or plasma, gas, or heat distribution assemblies) inside a process chamber or loadlock. Examples of such assemblies include cathode assemblies in etch process chambers or loadlocks, heater pedestal assemblies and gas distribution showerhead assemblies in chemical vapor deposition and atomic layer deposition process chambers, and substrate pattern masking assemblies in bevel etch process chambers or loadlocks. Bevel edge etching may be used to remove undesirable portions of a deposition film on an edge region of a substrate.

In accordance with one or more embodiments, FIGS. 2A-2E illustrate various configurations of substrate support and process delivery apparatus in a process chamber or loadlock, which may be similar or identical to one or more of process chambers 114, 116, and/or 118, and/or loadlock 120.

FIG. 2A illustrates a process chamber or loadlock 214A that includes a process apparatus motor 232A configured to move process delivery apparatus 233A vertically downward during a gap calibration such that a bottom surface of process delivery apparatus 233A directly contacts atop surface of substrate 202A or substrate support 203A (e.g., in those cases where substrate 202A is not yet received on substrate support 203A).

FIG. 2B illustrates a process chamber or loadlock 214B that includes a substrate support motor 234B configured to move substrate support 203B vertically upward during a gap calibration such that a top surface of substrate 202B or substrate support 203B (e.g., in those cases where substrate 202B is not yet received on substrate support 203B) directly contacts a bottom surface of process delivery apparatus 233B.

FIG. 2C illustrates a process chamber or loadlock 214C that includes both a process apparatus motor 232C configured to move process delivery apparatus 233C vertically downward and a substrate support motor 234C configured to move substrate support 203C vertically upward such that direct contact occurs during a gap calibration between a bottom surface of process delivery apparatus 233C and a top surface of substrate 202C or substrate support 203C (e.g., in those cases where substrate 202C is not yet received on substrate support 203C).

FIG. 2D illustrates a substrate support 203D (with chamber not shown) having a pocket 205D for receiving a substrate 202D therein. A substrate support motor 234D is configured to move substrate support 203D vertically upward such that during a gap calibration direct contact occurs between top substrate support surfaces 207D and a bottom surface of process delivery apparatus, such as, e.g., process delivery apparatus 233A, 233B, and/or 233C, even though substrate 202D is received on substrate support 203D.

And FIG. 2E (with chamber not shown) illustrates a substrate support motor 234E configured to move substrate support 203E vertically upward, wherein substrate support 203E has pins or shafts 209E for supporting a substrate 202E, such that during a gap calibration direct contact occurs between a top surface of substrate 202E and a bottom surface of process delivery apparatus, such as, e.g., process delivery apparatus 233A, 233B, and/or 233C.

The moving process components shown in FIGS. 2A-2E may include actuators with large torque drive trains. Such large torque drive trains may be used to transport and/or support a substrate in order to provide a rigid and stable platform for the substrate that results in a consistently planar surface with minimum vibration. Such rigid process components may have large wall thicknesses and may be constructed of materials resistant to deformation, such as, e.g., steel or ceramic. The large wall thicknesses and the deformation resistant materials may contribute to a larger moving mass. These process components may also provide multiple functions including, e.g., heating, cooling, and mechanically or electrostatically chucking a substrate, and thus may include a large number of nested sub-components that may include heating, cooling, substrate chucking, and gas distribution elements. Furthermore, a substrate may be continuously under vacuum in a process chamber, and to isolate the vacuum environment from atmosphere, a vacuum isolation element such as a bellow may be included with these process components. As such, large pressure forces may develop across these vacuum isolation interfaces when large diameter vacuum isolation elements are employed for enclosing actuator shafts that bridge the actuator to the load in vacuum. The diameter of the actuator shaft should be of sufficient internal diameter to accommodate supply and return channels for fluid, gas, and electrical power. Axial forces may develop at vacuum isolation interfaces that may be proportional to the diameter of the vacuum isolation element. Thus, such process components may have significant payloads that require large torque high-efficiency ball screw drive trains that consequently have the capability of damaging (e.g., crushing) some process components.

Supplementary feedback devices may also be embedded in a process chamber for real time gap measurement and control in accordance with one or more embodiments. These feedback devices may be a direct-contact or non-contact type and may include, e.g., optical sensors, capacitive sensors, inductive sensors, and/or CCD (charge coupled device) cameras. Practical limitations of embedding sensors in process chambers or loadlocks may include the exposure of fragile sensor packaging and electronics to elevated process temperature and strong chemical reactions, susceptibility of electronics to high frequency electrical and plasma noise from the process chamber, and added mechanical complexity from having to maintain vacuum integrity when packaging the sensor and routing signals in tight spaces.

Motion control systems and methods in accordance with one or more embodiments advantageously provide completely closed-chamber and in-situ substrate gap calibration at process pressures (ranging from, e.g., 0.01 Torr to about 80 Torr) and/or at process temperatures (ranging from, e.g., 100 degrees C. to 700 degrees C.). Thus, a process chamber or loadlock may need not to be taken offline for typically very manually involved maintenance procedures in order to perform gap calibration. The motion control systems and methods of the disclosure may also advantageously eliminate the need for specialized and supplemental sensors, products, and/or tools for gap measurement and calibration. The motion control systems and methods of the disclosure may further advantageously not require additional mechanical or electrical complexity wherein, in some embodiments, actuator feedback signals may be directly used. The motion control systems and methods of the disclosure may still further advantageously combine the principles of gain scheduling, distributed motion planning, and signal processing to routinely confirm and maintain accurate gap control at the center of the process using a primary actuator's feedback. The motion control systems and methods of the disclosure may be less sensitive to a processing environment and may account for the actual dimension altering effects of thermal expansion (caused by high process temperatures) on gap spacing, thereby increasing the accuracy of gap calibration and control.

Motion control systems and methods in accordance with one or more embodiments advantageously may overcome a number of practical limitations, which may include (1) large torque actuators capable of exceeding the allowable stress limits of structural components inside a process chamber, (2) gross mechanical flexure of structural components of a process chamber or loadlock, (3) distributed motion network bandwidth limitations imposed on motion control signals and motion feedback signals, and (4) noise in motion feedback signals.

Figure 3:
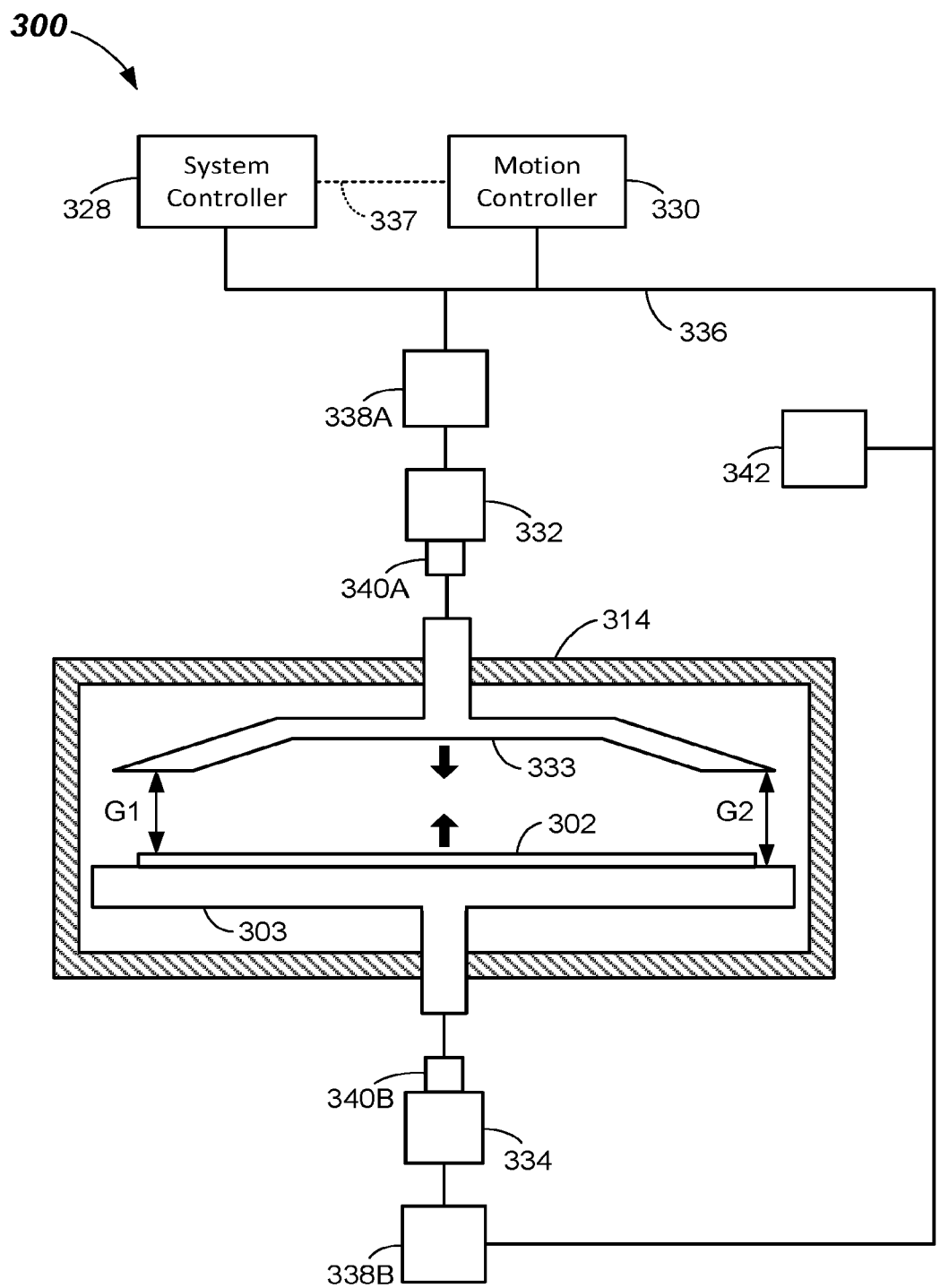
FIG. 3 illustrates a schematic side view of a motion control system according to embodiments of the disclosure.

FIG. 3 illustrates a motion control system 300 that may be used in an electronic device manufacturing system, such as, e.g., electronic device manufacturing system 100. Motion control system 300 may be used to control movements within a process chamber or loadlock 314 of process delivery apparatus 333 (which may be, e.g., identical or similar to process delivery apparatus 233A or 233C of FIG. 2) and/or a substrate support 303 (which may be, e.g., identical or similar to substrate supports 203B-E of FIG. 2) in accordance with one or more embodiments. Process chamber or loadlock 314 may be evacuated uniformly by a vacuum pump (not shown). Substrate support 303 may be centrally disposed in process chamber or loadlock 314 and, in some embodiments, substrate support 303 may include at least one embedded heater, which may be operable to controllably heat substrate support 303 and a substrate 302 received thereon to a predetermined temperature.

Motion control system 300 may include a motion controller 330, which may be identical or similar to motion controller 130 of FIG. 1. Motion control system 300 may also include one or more actuators 332 and 334, a communications network 336 coupled to motion controller 330, one or more actuator drivers 338A and 338B each coupled to communications network 336, and one or more feedback devices 340A and 340B. Feedback devices 340A and 340B may each be, e.g., a position sensor and/or other suitable sensor device(s) configured to sense, e.g., velocity, torque, current, force, and/or strain. Depending on the configuration of substrate support 303 and process delivery apparatus 333, actuators 332 and 334 may be one or more of, e.g., a process apparatus motor and/or a substrate support motor, such as, e.g., process apparatus motors 232A and/or 232C and/or substrate support motors 234B-E. Process delivery apparatus 333 may include a pattern mask and/or a plasma or gas distribution assembly.

In some embodiments, actuator 332 may be a multidirectional movement device configured to move and position process delivery apparatus 333 relative to substrate 302. Actuator 332 may be part of an electrical motor-based system, which can be used to adjust the position of process delivery apparatus 333 along all three axes (X-Y-Z). In some embodiments, actuator 332 may include a mechanical fixture in connection with an electric motor that can move process delivery apparatus 333 in a first direction. The electric motor via a second fixture, such as a stainless steel ring, may then move process delivery apparatus 333 in a second direction and a third direction. Thus, by pivoting process delivery apparatus 333 while moving process delivery apparatus 333 up and down, process delivery apparatus 333 may be repositioned along all three axes. Furthermore, actuator 332 may level process delivery apparatus 333 relative to substrate support 303.

A system controller 328, which may be a system controller of an electronic device manufacturing system, such as, e.g., system controller 128 of FIG. 1, may communicate with motion controller 330 and/or actuator drivers 338A and 338B via communications network 336 or, alternatively, via a dedicated communication channel 337 coupled directly to motion controller 330. Alternatively, system controller 328 may perform the functions of motion controller 330, which may be omitted.

Actuator driver 338A may communicate with and control corresponding actuator 332 and feedback device 340B, and actuator driver 338B may communicate with and control corresponding actuator 334 and feedback device 340B. Actuator drivers 338A and 338B are each configured to provide controlled motion of respective actuators 332 and 334 and thereby control respective movement of process delivery apparatus 333 and/or substrate support 303. Actuator drivers 338A and 338B may each include programmable processing capability configured to execute programmable instructions/software programs/firmware that may include, e.g., a position feedback loop, a velocity feedback loop, and a motion planner, as described in more detail below in connection with FIG. 4 and SA-B.

Motion controller 330 may include a programmable processor and a memory that stores processor executable instructions/software programs/firmware and data received from actuator drivers 338A and 338B and feedback devices 340A and 340B. Motion controller 330 may also include various support circuits (e.g., for a power supply and network communications) and input/output circuits. In some embodiments, motion controller 330 may include executable instructions/software programs/firmware having signal processing capability stored in its memory and executable by its programmable processor. In addition to actuator drivers 338A and 338B, motion controller 330 may also be coupled via communications network 336 to one or more other remote devices 342, which may be, e.g., one or more I/O modules providing, e.g., signals based on position, alignment, or other status of one or more process components.

Motion controller 330 may communicate over communications network 336 using, e.g., the CANopen® (Controller Area Network open) communication protocol. The CANopen® protocol is based on a master-slave communication model. As such, motion controller 330 may be the CANopen® node designated as the master, which sends and requests data to and from the slaves, which may be actuator drivers 338A and 338B and any other remote devices 342 designated as slaves. Using this communication model, the master is able to start, stop, and reset the slaves, among other commands. In accordance with one or more embodiments, motion controller 330 (the master) may execute all instructions and transmit all commands over communications network 336 to actuator drivers 338A and 338B, which may be referred to as remote nodes (slaves). In some embodiments, communications network 336 may operate at a sampling rate greater than about 50 Hz and less than about 1000 Hz. An example motion instruction, when executed by one or both of actuator drivers 338A and 338B, may initiate movement of one or both of actuators 332 and 334 between a first position and a second position within predefined constraints of velocity and acceleration.

Figure 4:
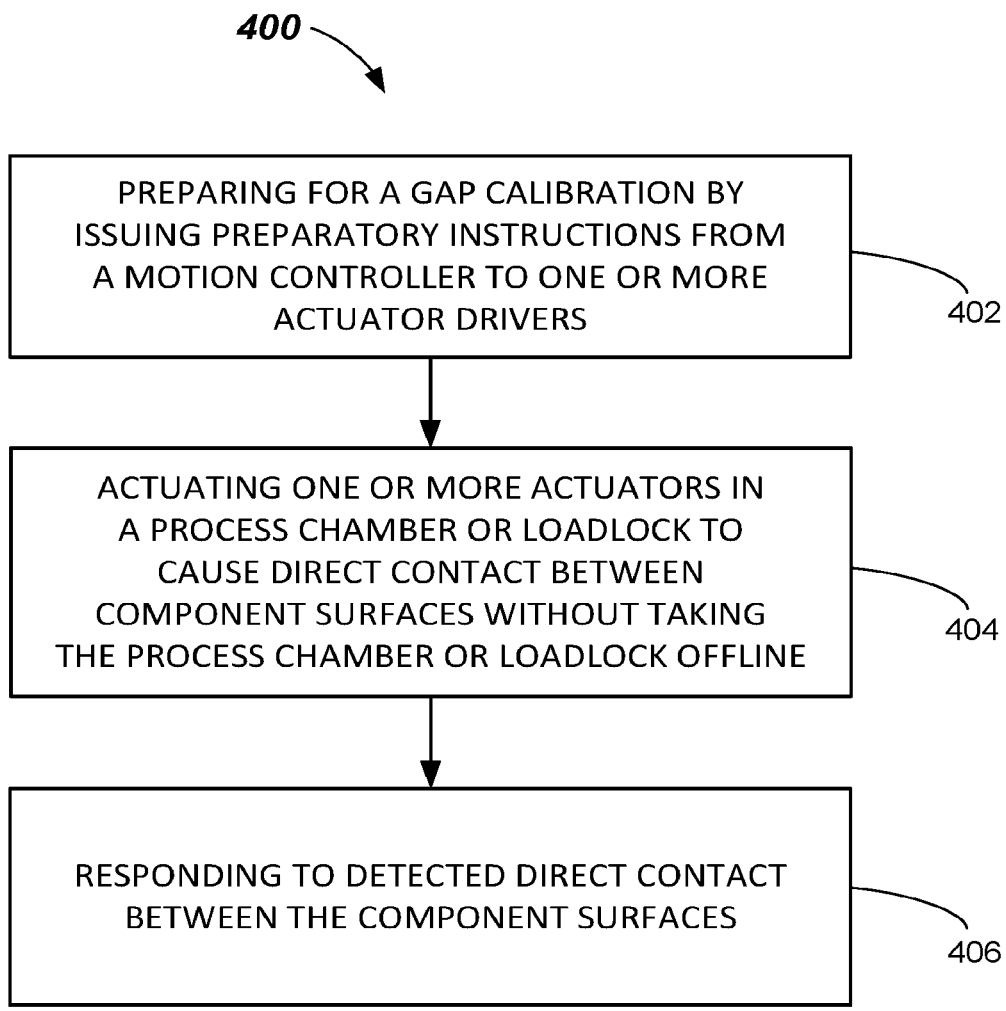
FIG. 4 illustrates a flowchart of a method of calibrating a gap between component surfaces in a process chamber or a loadlock of an electronic device manufacturing system according to embodiments of the disclosure.

FIG. 4 illustrates a method 400 of calibrating a gap between process components in a process chamber or loadlock of an electronic device manufacturing system, such as electronic device manufacturing system 100, without taking the process chamber or loadlock offline in accordance with one or more embodiments. Method 400 may be performed by a motion controller, such as, e.g., motion controller 130 (of FIG. 1) or motion controller 330 (of FIG. 3) in any one of process chambers 114, 116, 118 and loadlock 120 of FIG. 1, process chambers or loadlocks 214A-C of FIG. 2, process chamber or loadlock 314 of FIG. 3, and any other chamber where substrate processing may occur.

Method 400 may calibrate a gap such as a gap G1 (see FIG. 3) between process delivery apparatus 333 and substrate 302, and/or a gap G2 between process delivery apparatus 333 and substrate support 303 (in those cases where substrate 302 has not yet been received on substrate support 303).

A software control program, e.g., executing in the motion controller (master) may identify the software/firmware executing in one or more actuator drivers (slaves), such as, e.g., actuator drivers 338A and 338B of FIG. 3, and may transmit instructions over a communication network, such as, e.g., communication network 336, to the actuator drivers. Upon receiving instructions and upon completing instructions, the actuator drivers communicate with the motion controller (master) to indicate completion. Subsequent instructions are dependent on prior instructions having successfully completed in the actuator drivers.

Distributed motion networks in accordance with one or more embodiments may permit distributed motion planning while providing close coordination with instructions from the motion controller (master). Software programs/firmware may be stored respectively in the motion controller (master) and in the actuator drivers (slave). This may allow motion planning to be distributed among the master and slave(s) and reduces the burden on the master and the communication network by reducing the amount of data transfer that may occur over the communication network. For example, a motion instruction with respect to gap calibration generated by the motion controller (master) may initiate movement of an actuator (e.g., a motor) between a first position (e.g., a safe starting position) and a second position (e.g., a target position beyond the expected contact position) within predefined constraints of velocity and acceleration. The motion instruction may be received by a motion planner internal to an actuator driver (slave) which, based on the motion instruction data, generates a motion profile precisely describing the motion of the actuator (e.g., motor) on an instant by instant basis to control speed and acceleration changes, e.g., to limit "jerk," the first derivative of acceleration, the latter which may produce undesired wear or oscillations on the motor and attached components.

Accordingly, the commanded motion data need not be transmitted over the communication network, but only the higher-level motion command that initiates the motion planner in the actuator drivers. The distributed nature of motion planning frees up communication network traffic for transmitting real-time process data including motion feedback data (which may be between one sample per millisecond and one sample per 20 milliseconds) from the actuator drivers to the motion controller without reducing motion positioning performance. As will become apparent, this also allows the motion controller (master) to control multiple actuator drivers (slaves) concurrently for gap calibration or other functions. Method 400 may therefore be performed in a motion control system having motion-planning capable actuator drivers in accordance with one or more embodiments.

At process block 402, method 400 may begin by preparing for a gap calibration by issuing preparatory instructions from the motion controller (master) to the one or more actuator drivers (slaves). This may include opening or establishing communication between the motion controller (master) and the one or more actuator drivers (slaves). The number of actuator drivers depends on the process component configuration (see, e.g., FIGS. 2A-E). In particular, process block 402 may include issuing one or more of the following preparatory instructions from the motion controller (master) to configure and/or operate the one or more actuator drivers (slaves)

(1) Set the mode of operation in the one or more actuator drivers to allow the one or more actuator drivers to generate (or plan) the appropriate motion profile internally. For example, the actuator driver may provide a position control mode of operation in which a trapezoidal position profile is generated internally by the motion planner in the actuator driver within predefined constraints on velocity and acceleration.

(2) Command one or more actuators, such as, e.g., actuators 332 and/or 334, to move to a safe starting position from an expected contact position between two pre-defined surfaces, such as, e.g., a top surface of substrate 302 and a bottom surface of process delivery apparatus 333.

(3) Disable relevant fault protections in the one or more actuator drivers including position tracking error such that the gap calibration process does not prematurely fault-out.

(4) Set (or schedule) position loop and velocity loop feedback gains (which may be referred to as PID gains) in the one or more actuator drivers to reduce a low frequency actuator (e.g., motor) response (i.e., the rate at which an actuator (e.g., motor) current (torque) responds to very-slow time-varying disturbance such as a direct contact obstruction).

(5) Set (or schedule) commanded velocity to a very low actuator shaft frequency (which may be less than one rpm; when the gap calibration motion is triggered to start, the actuator shaft frequency may be low enough that when combined with the elimination of integral action on actuator current, the actuator current may not respond rapidly to obstructed motion at direct contact of the process components and this may greatly reduce the contact forces on those components).

(6) Set (or schedule) the commanded position to a target position that exceeds the expected contact position to ensure that contact between process component surfaces does occur.

Figure 5A:
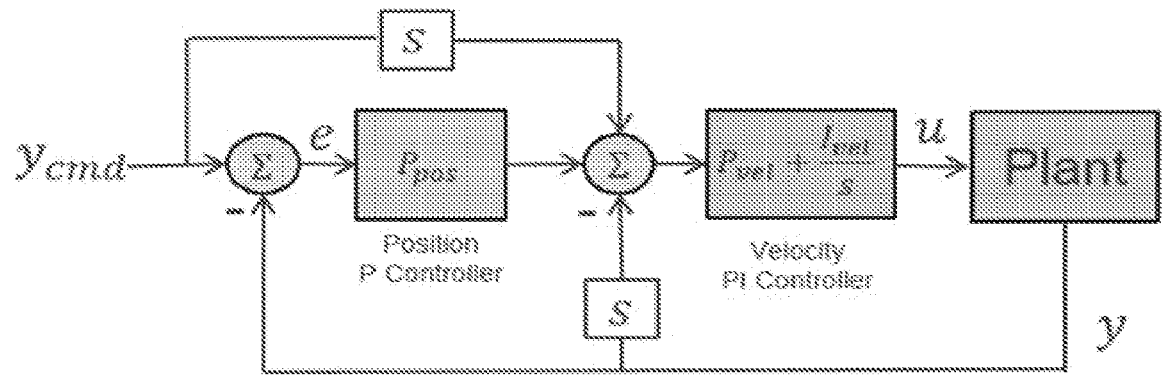
FIGS. 5A and 5B illustrate position and velocity software control loops executable in an actuator driver according to embodiments of the disclosure.
Figure 5B:
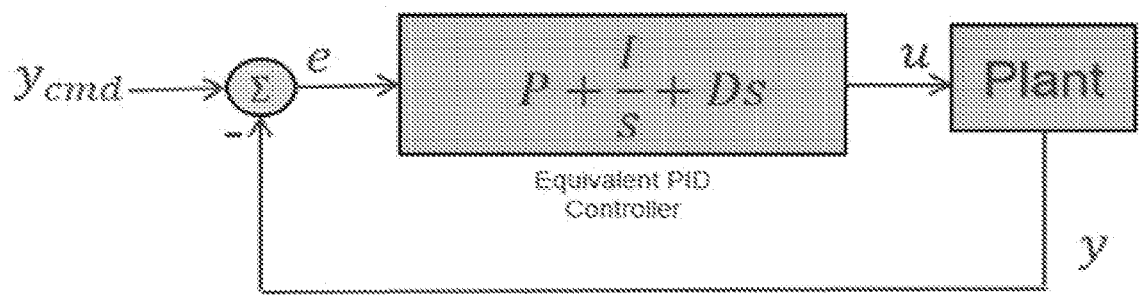

Regarding preparatory instruction (4), in one or more embodiments as shown in FIGS. 5A and 5B, the position and velocity loops in the actuator drives may be in a cascaded form. FIG. 5A depicts a general control system divided into the "plant" and the controller. A goal of this control system is to drive the plant in response to the command (y cmd) while overcoming disturbances. The plant includes a feedback device and the element or elements that produce the system response. For example, the plant may be a motor coupled to its load with a feedback device attached to the motor, the load, or to both. The plant receives the controller output (u) from the power converter (not shown) and sends the feedback signal (y) to the controller. The controller can be divided into the cascaded position and velocity loops. The position loop contains the position proportional gain (Ppos) and receives the error signal (e) that is the difference between commanded position (y cmd) and the feedback signal (y). The velocity loop contains the velocity proportional gain (Pvel) and the velocity integral gain (Ivel). The velocity loop receives the sum of the signals that includes the output of the position loop, the derivative of the commanded position (commanded velocity), and the derivative of the feedback signal. The terms represents a differentiation operation on the signal and the term 1/s represents an integration operation on the signal. Similarly, FIG. 5B depicts a general control system divided into the plant and the controller. The controller in this case consists of a single loop and contains the proportional gain (P), integral gain (I), and the derivative gain (D). According to PID theory, each of the control terms within the controller shown in FIGS. 5A and 5B are dominant in one of low, middle, or high frequency zones of an actuator current response. By setting the terms that provide integral action upon the actuator current, the rate at which the actuator current (torque) responds to very-slowly time-varying disturbances can be effectively slowed. In some embodiments, this may be accomplished by sending instructions from the motion controller (master) to the one or more actuator drivers to set the "Ivel" term in FIG. 5A and the "I" term in FIG. 5B to zero.

At process block 404, method 400 may include actuating the one or more actuators in the process chamber or loadlock to cause direct contact between process component surfaces without taking the process chamber or loadlock offline. In particular, process block 404 may include the motion controller (master) performing the following:

(1) Polling (i.e., collecting) on a continuous basis and charting a time series of process data from one or more feedback devices, such as, e.g., feedback devices 340A and/or 340B. This process feedback may include position, position error, actuator (e.g., motor) current, actuator (e.g., motor) velocity, strain, force, or other signals available on the communication network. The sampling rate may be the maximum allowed on the communication network (which may range from about one sample per millisecond to one sample per 20 milliseconds)

(2) Filtering digitally (i.e., removing) via the software control program executing in the motion controller stochastic (random) noise and deterministic (periodic) noise from actuator (e.g., motor) feedback. Actuators used in process chambers and loadlocks herein may have low frequency mechanical resonance caused by one or more of the following: compliance between a motor and a load, misalignment of bearing and motor axis, eccentricity of rotating components, and/or pulsating torque ripples from motor cogging at low velocities. Low pass, band pass, and notch pass filters may each be used to filter undesired frequencies considered noise. Filtering is used to improve the signal-to-noise ratio such that the software control program executing in the motion controller may more clearly and more rapidly discern and respond to the direct contact between process component surfaces.

(3) Estimating actuator feedback via the software control program executing in the motion controller using a circular moving average filter to fit the actual feedback signal. By creating a sufficiently large signal buffer in the motion controller's memory that is equivalent to at least one actuator (e.g., motor) revolution, the software control program executing in the motion controller may create a derived estimated feedback signal and a second derived residual signal, which may be the difference between the estimated and actual feedback.

(4) Detecting direct contact between the surfaces of process delivery apparatus and a substrate or a substrate support. In real-time with the actuator in motion, the estimated and actual signals may deviate sharply at the point of direct contact between the surfaces of process delivery apparatus and a substrate or a substrate support. When obstructed motion is encountered, the estimated motor feedback may not deviate whereas the actual feedback may deviate rapidly. In turn, the residual signal may rise or drop very rapidly and the software control program executing in the motion controller may thus detect direct contact inside the process chamber or loadlock sufficiently accurately and rapidly.

At process block 406, method 400 may include responding to detected direct contact between component surfaces, such as, e.g., the surfaces of process delivery apparatus and a substrate or a substrate support in a process chamber or loadlock. In particular, process block 406 may include the motion controller executing the software control program to issue instructions to halt the motion driven by the one or more actuators and to record the calibration positions of the one or more actuators into the memory of the motion controller. The calibration positions may include the actual actuator position at the contact position and at a defined mechanical gap spacing (e.g., as small as' mil). Process block 406 may also include the software control program issuing instructions to restore the mode of operation in the one or more actuator drivers to a normal operating mode.

The foregoing description discloses only example embodiments of the disclosure. Modifications of the above-disclosed apparatus, systems, and methods may fall within the scope of the disclosure. Accordingly, while example embodiments of the disclosure have been disclosed, it should be understood that other embodiments may fall within the scope of the disclosure, as defined by the following claims.

What is claimed is:

1. A motion control system of an electronic device manufacturing system comprising:
   a motion controller;
   an actuator driver coupled to the motion controller;
   an actuator coupled to the actuator driver and to a process delivery apparatus or a substrate support located in a process chamber or loadlock, the actuator configured to move the process delivery apparatus or the substrate support; and
   a feedback device coupled to the actuator and to the motion controller;
   wherein the motion controller is configured to:
   cause direct contact between respective surfaces of the process delivery apparatus and the substrate support or a substrate received on the substrate support; and
   perform gap calibration based on the direct contact.

2. The motion control system of claim 1, wherein the motion controller, the actuator driver, the actuator, and the feedback device are configured to operate during the gap calibration while at least one of a) the process chamber or loadlock is at a process temperature or b) the process chamber or loadlock is at a process pressure.

3. The motion control system of claim 2, wherein the process temperature ranges from 100 degrees C. to 700 degrees C. and the process pressure ranges from 0.01 Torr to about 80 Torr.

4. The motion control system of claim 1, wherein the actuator driver comprises at least one of a signal processing capability, a position feedback loop, a velocity feedback loop, or a motion planner.

5. The motion control system of claim 1, wherein the motion controller comprises at least one of a signal processing capability or a motion planner.

6. The motion control system of claim 1, further comprising a communication network coupled to the motion controller, the actuator driver, the actuator, and the feedback device, the communication network using a master-slave communication protocol.

7. The motion control system of claim 1, wherein the feedback device measures at least one of position, velocity, torque, current, force, or strain.

8. The motion control system of claim 1, wherein:
the actuator driver comprises a plurality of actuator drivers;
the actuator comprises a plurality of actuators; and
the feedback device comprises a plurality of feedback devices;
wherein the pluralities of actuator drivers, actuators, and feedback devices are concurrently operated by the motion controller.

9. An electronic device manufacturing system, comprising:
a transfer chamber;
a process chamber coupled to the transfer chamber, the transfer chamber configured to transfer one or more substrates to and from the process chamber, the process chamber configured to process the one or more substrates therein;
a loadlock coupled to the transfer chamber, the transfer chamber configured to transfer the one or more substrates to and from the loadlock; and
a motion controller configured to:
cause direct contact within the process chamber between respective surfaces of a process delivery apparatus and a substrate support or one of the one or more substrates received on the substrate support; and
perform gap calibration based on the direct contact.

10. The electronic device manufacturing system of claim 9, wherein the loadlock is configured to process one or more of the one or more substrates therein.

11. The electronic device manufacturing system of claim 10, wherein the motion controller is further configured to cause direct contact within the loadlock between respective surfaces of a loadlock process delivery apparatus and a loadlock substrate support or one of the one or more substrates received on the loadlock substrate support.

12. The electronic device manufacturing system of claim 9, wherein at least one of a) the process chamber or the loadlock is at a process temperature during the gap calibration or b) the process chamber or the loadlock is at a process pressure during the gap calibration.

13. The electronic device manufacturing system of claim 9, further comprising:
an actuator driver coupled to the motion controller;
an actuator coupled to the actuator driver and to the process delivery apparatus or the substrate support located in the process chamber, the actuator configured to move the process delivery apparatus or the substrate support; and
a feedback device coupled to the actuator and to the motion controller.

14. A method of calibrating a gap between component surfaces in a process chamber or a loadlock of an electronic device manufacturing system, the method comprising:
actuating one or more actuators in the process chamber or the loadlock to cause direct contact between the component surfaces without taking the process chamber or the loadlock offline; and
responding to detected direct contact between the component surfaces;
wherein the actuating and the responding are performed while maintaining at least one of a) the process chamber or loadlock at a process temperature or b) the process chamber or loadlock at a process pressure.

15. The method of claim 14, further comprising:
setting a mode of operation in one or more actuator drivers to a gap calibration mode to enable the one or more actuator drivers to generate a motion profile;
commanding the one or more actuators to move to a safe starting position;
disabling fault protections in the one or more actuator drivers;
setting position loop and velocity loop feedback gains;
setting a commanded velocity to a low shaft frequency; and
setting a commanded position to a target position that exceeds an expected contact position.

16. The method of claim 14, wherein the actuating comprises:
polling and charting a time series of process data from one or more feedback devices;
filtering, by a motion controller, stochastic noise and deterministic noise from actuator feedback;
estimating, by the motion controller, the actuator feedback using a circular moving average filter to fit an actual feedback signal; and
detecting direct contact between the component surfaces.

17. The method of claim 14, wherein the responding comprises:
halting motion of the one or more actuators;
storing calibration positions of the one or more actuators into a memory of a motion controller; and
restoring a mode of operation in one or more actuator drivers to a normal operating mode.

18. The method of claim 14, wherein the component surfaces comprise surfaces of a a) process delivery apparatus and b) a substrate or a substrate support.

19. The method of claim 14, wherein the process temperature ranges from 100 degrees C. to 700 degrees C. and the process pressure ranges from 0.01 Torr to about 80 Torr.

20. The method of claim 14, further comprising:
performing gap calibration based on the detected direct contact between the component surfaces.

* * * * *